(12) United States Patent
Stauffenegger et al.

(10) Patent No.: US 8,896,312 B2
(45) Date of Patent: Nov. 25, 2014

(54) COMPACT CRYOGENIC NMR SENSOR WITH INTEGRATED ACTIVE COOLING DEVICE

(75) Inventors: Philippe Stauffenegger, Duebendorf (CH); Klemens Kessler, Oberneunforn (CH); Marco Tomaselli, Zurich (CH); Sven Radke, Effretikon (CH); Bernhard Felber, Volketswil (CH)

(73) Assignee: Bruker BioSpin AG, Faellanden (CH)

( * ) Notice: Subject to any disclaimer, the term of this patent is extended or adjusted under 35 U.S.C. 154(b) by 469 days.

(21) Appl. No.: 13/409,135

(22) Filed: Mar. 1, 2012

(65) Prior Publication Data

US 2012/0242336 A1 Sep. 27, 2012

(30) Foreign Application Priority Data

Mar. 25, 2011 (DE) .......................... 10 2011 006 164

(51) Int. Cl.
*G01V 3/00* (2006.01)
*G01R 33/34* (2006.01)
*G01R 33/565* (2006.01)

(52) U.S. Cl.
CPC ...... *G01R 33/3403* (2013.01); *G01R 33/34023* (2013.01); *G01R 33/56509* (2013.01)
USPC ........................................................ 324/321

(58) Field of Classification Search
USPC ................................. 324/300–322
See application file for complete search history.

(56) References Cited

U.S. PATENT DOCUMENTS

| | | | | |
|---|---|---|---|---|
| 4,535,595 A | * | 8/1985 | Keller et al. | 62/3.1 |
| 5,129,232 A | | 7/1992 | Minas | |
| 5,864,273 A | | 1/1999 | Dean | |
| 5,889,456 A | | 3/1999 | Triebe | |
| 5,895,033 A | | 4/1999 | Ross | |
| 5,966,944 A | * | 10/1999 | Inoue et al. | 62/51.1 |
| 6,354,087 B1 | * | 3/2002 | Nakahara et al. | 62/6 |
| 6,389,821 B2 | * | 5/2002 | Strobel et al. | 62/47.1 |
| 6,809,486 B2 | | 10/2004 | Qiu | |
| 6,833,701 B2 | * | 12/2004 | Marek | 324/307 |
| 7,003,963 B2 | | 2/2006 | Alford | |

(Continued)

OTHER PUBLICATIONS

A. Veprik et al., "Dynamically counterbalanced the single-piston linear compressor of a Stirling cryogenic cooler", Cryogenic, 49 (2009) 165-170.

*Primary Examiner* — Dixomara Vargas
(74) *Attorney, Agent, or Firm* — Paul Vincent

(57) ABSTRACT

An NMR measuring system with an NMR probehead has at least one cooling device (5a, b) generating a vibration spectrum of individual selective frequencies. The cooling device is mechanically connected to a vibration absorber (9a, 9b) having an oscillating mass element (27), whose resonance frequency is adjusted to the vibration frequency of the cooling device and/or to one of its harmonics. The cooling device has a cooling head which is thermally connected to an NMR resonator of the probehead via a flexible mechanical element. A vacuum housing of the probehead is designed in two parts which are mechanically connected via at least one damping element (30a-d). The lower part and the upper part of the vacuum housing are additionally mechanically flexibly connected to each other in a vacuum-tight fashion via a corrugated bellows (8a, 8b). The system minimizes sidebands in NMR spectra.

15 Claims, 5 Drawing Sheets

(56) References Cited

U.S. PATENT DOCUMENTS

| | | | |
|---|---|---|---|
| 7,430,871 B2* | 10/2008 | Strobel | 62/51.1 |
| 7,430,872 B2* | 10/2008 | Strobel | 62/51.1 |
| 7,474,099 B2* | 1/2009 | Boesel et al. | 324/318 |
| 7,501,822 B2* | 3/2009 | Sacher et al. | 324/318 |
| 7,514,922 B2* | 4/2009 | Freytag | 324/307 |
| 7,764,153 B2* | 7/2010 | Isogami et al. | 335/216 |
| 7,852,629 B2* | 12/2010 | Yu | 361/699 |
| 7,859,374 B2* | 12/2010 | Iwasa et al. | 335/216 |
| 8,053,946 B2* | 11/2011 | Koizumi et al. | 310/266 |
| 8,228,148 B2* | 7/2012 | Iwasa et al. | 335/216 |
| 8,409,807 B2* | 4/2013 | Neely et al. | 435/6.12 |
| 8,563,298 B2* | 10/2013 | Lowery et al. | 435/287.2 |
| 2005/0229620 A1 | 10/2005 | Kirichek | |

\* cited by examiner

COMPACT CRYOGENIC NMR SENSOR WITH INTEGRATED ACTIVE COOLING DEVICE

This application claims Paris Convention priority of DE 10 2011 006 164.9 filed Mar. 25, 2011 the complete disclosure of which is hereby incorporated by reference.

BACKGROUND OF THE INVENTION

The invention concerns an NMR (nuclear magnetic resonance) measuring system, comprising an NMR probehead in a vacuum housing, the NMR probehead being positioned inside an NMR magnet system during operation and containing a test sample and at least one NMR resonator that is cooled to cryogenic temperatures by means of a first cooling device, wherein the NMR resonator is thermally connected to a cooling head of the first cooling device via a heat conducting carrier element and via a first heat conducting connecting element.

An NMR measuring system of this type is disclosed e.g. in U.S. Pat. No. 5,889,456 (document [1]).

FIG. 2 schematically shows the prior art described in [1].

NMR spectroscopy has become a highly established technology, which is used for different applications such as e.g. MRI and high-resolution NMR spectroscopy on liquid samples. The signal-to-noise ratio (SNR) must have as large a value as possible in order to be able to utilize NMR technology in the first place. This is obtained i.a. with higher magnetic fields, with an optimum construction of the NMR resonators and, in particular, by cooling the NMR resonators and the associated NMR preamplifiers to cryogenic temperatures. Cryogenic liquids, e.g. liquid helium and/or liquid nitrogen and also active cooling devices are used for cooling.

Active cooling devices, however, are disadvantageous in that they operate with moving parts and therefore cause mechanical vibrations that must be optimally damped to prevent generation of excessively large sidebands in the NMR spectrum. The present patent proposes measures to achieve this object.

U.S. Pat. No. 5,889,456 [1] realizes cooling of the preamplifier or the NMR resonators with a complex separate cooling unit that cools the NMR resonators and the preamplifier via a heat exchanger using highly-cooled, compressed helium gas. The cooling devices used for this purpose are e.g. GM coldheads or pulse tubes. These cooling devices are disadvantageous due to the high maintenance and operating costs (electrical power>8 kW). The design of the heat exchangers also requires great effort.

U.S. Pat. No. 7,003,963 [2] describes the construction of an NMR probehead which is directly connected to a coldhead of a cooling device. This system does not require cryogenic liquids and gases outside of the cooling device, for which reason the construction of the overall system is very simple. Complex heat exchangers can be omitted and cooling power losses can be considerably limited. Moreover, the use of Free-Piston Stirling Coolers (FPSC) considerably improves the reliability of the cooling device.

However, due to direct coupling, the vibrations of the cooling device are directly transmitted to the NMR resonator, where they modulate the measured NMR signal. For this reason, strong sidebands are generated in the NMR spectrum. This is not admissible in high-resolution NMR.

In contrast thereto, it is the underlying purpose of the present invention to improve an NMR measuring system of the above-described type with as simple technical means as possible and in such a fashion that the sidebands in the NMR spectra are preferably minimized.

SUMMARY OF THE INVENTION

In accordance with the invention, this object is completely achieved in a surprisingly simple but very effective fashion in that at least the first cooling device and, if necessary, further cooling devices generate a vibration spectrum that only consists of individual selective frequencies, at least the first cooling device and, if necessary, the further cooling devices are mechanically connected to a vibration absorber that has at least one oscillating mass element, the resonance frequency of each of which is adjusted to the vibration frequency of the cooling device and/or to one of its harmonics in such a fashion that disturbing sidebands in the NMR spectrum are largely compensated for, wherein the cooling head of the cooling device is connected to the first heat conducting connecting element via a mechanically flexible further connecting element having good heat conducting properties and, if necessary, to one or more preamplifier(s), the vacuum housing of the probehead and, if necessary, a further vacuum housing with a preamplifier is/are each designed in two parts having a lower and an upper part and is/are mechanically connected to each other via at least one respective damping element, the lower part and the upper part of the vacuum housing of the probehead and, if necessary, of the further vacuum container with the preamplifier are additionally connected to each other in a vacuum-tight and mechanically flexible fashion via a diaphragm or corrugated bellows, the connecting element is fixed to the vacuum housing of the NMR probehead by means of heat insulating mountings, and the NMR probehead is mechanically fixed to a shim system.

This provides a suitable cooling device for cryogenically cooling an NMR probehead designed for high-resolution NMR spectroscopy, which generates mechanical vibrations that are easy to compensate for (e.g. a "free-piston Stirling cooler"), consumes little electrical power, is light-weight and inexpensive, and can be directly connected to the NMR probehead in such a fashion that, after suitable compensation and damping measures, acceptable high-resolution spectra can be taken. This means that the generated vibration sidebands in the NMR spectrum can be suppressed by at least −50 dbm compared to the strongest line in the NMR spectrum (e.g. water or solvent line).

In one particularly preferred embodiment of the invention, at least one further cooling device is provided, which has a cooling head and is generally used to cool electronic components such as preamplifiers.

In one class of advantageous embodiments of the inventive NMR measuring system, at least the first cooling device and, if necessary, further cooling devices are designed as FPSC (Free-Piston Stirling Cooler).

One embodiment of the invention is also particularly preferred, which is characterized in that the further connecting element that has good thermal conducting properties and is mechanically flexible, has an inexpensive wire connector that is easily obtainable and is simple and easy to handle.

In further preferred embodiments, at least three damping elements are disposed between the lower part and the upper part of the vacuum housing of the probehead and, if necessary, of further vacuum housings with preamplifiers.

One advantageous further development of this embodiment is characterized in that the damping elements are symmetrically arranged around a longitudinal axis of the probehead in a plane perpendicular to the longitudinal axis.

Of particular advantage are embodiments of the invention, in which the cooling device is mechanically connected via at least three further damping elements to the laboratory floor on which the inventive NMR measuring system stands.

The connecting element advantageously consists entirely or partially of copper, the carrier element consists entirely or partially of copper or sapphire, and the NMR resonator consists entirely or partially of high-temperature superconductor (HTS) material.

One further particularly preferred embodiment of the inventive apparatus is characterized in that an active vibration absorber is provided, which contains a linear motor that can act on the motion of the mass element and is part of a closed control loop, wherein the linear motor is controlled by a digital control unit, which is also arranged in the control loop, in such a fashion that the mechanical vibrations of the cooling device and of the active vibration absorber at least mutually largely compensate each other.

In one advantageous further development of this embodiment, the control unit receives an error signal from an acceleration sensor via an analog-digital converter (ADC), and also a reference signal from an inductive sensor via an ADC, wherein the output of the control unit is connected to the linear motor via a digital-analog converter (DAC) and an amplifier unit.

This can be further improved in that the control unit contains an adaptive filter, the output signal of which is, at the same time, also the output signal of the control unit.

DESCRIPTION OF THE PREFERRED EMBODIMENT

Figure 1:
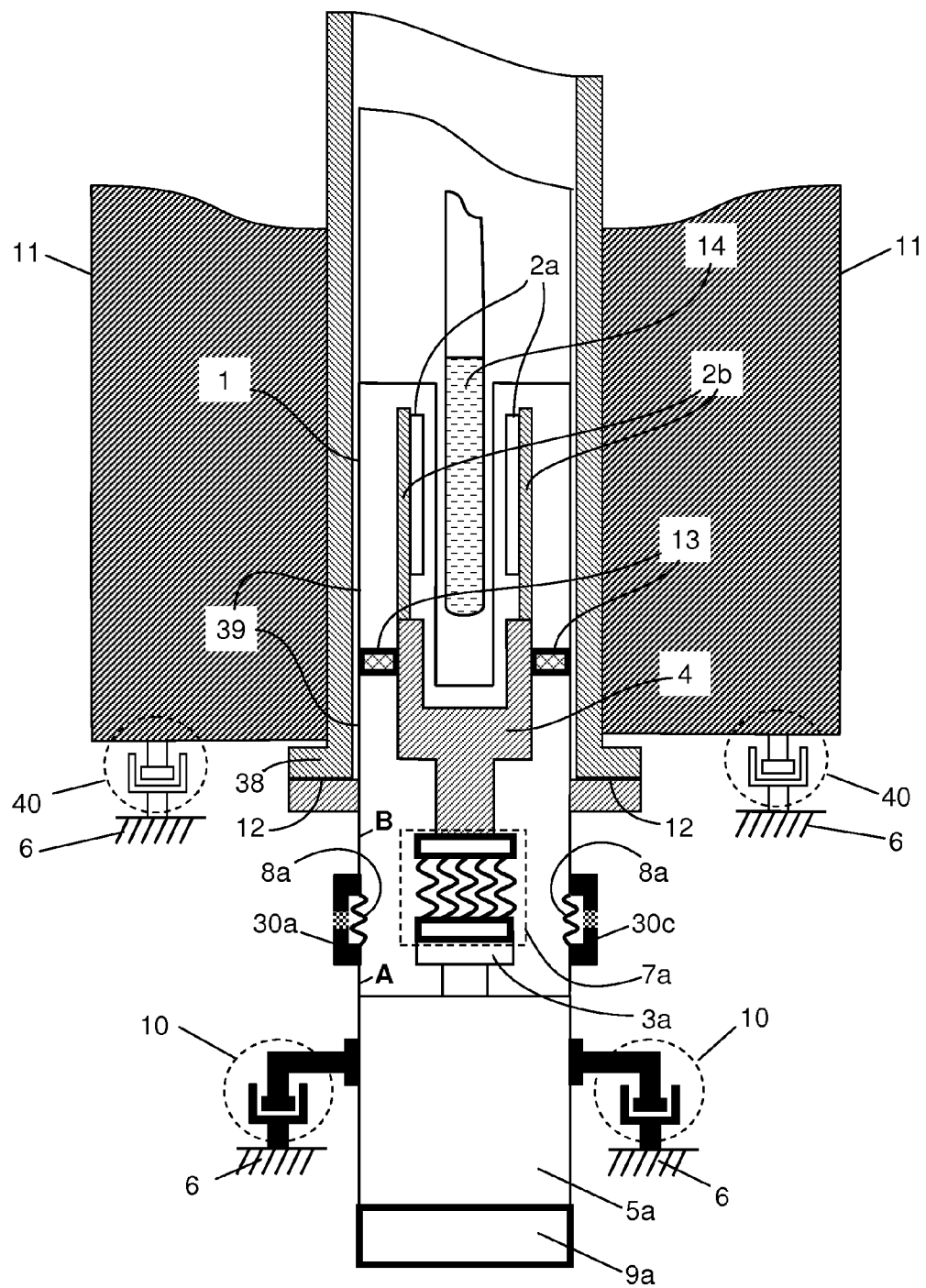
FIG. 1 shows an inventive NMR measuring system consisting of a cooling device 5a with passive vibration absorber 9a, wherein the cooling head 3a of the cooling device is connected to the connecting element 4 of the probehead 1 in a thermally well conducting fashion, and the NMR measuring system contains several devices for damping the vibrations of the cooling device.
Figure 2:
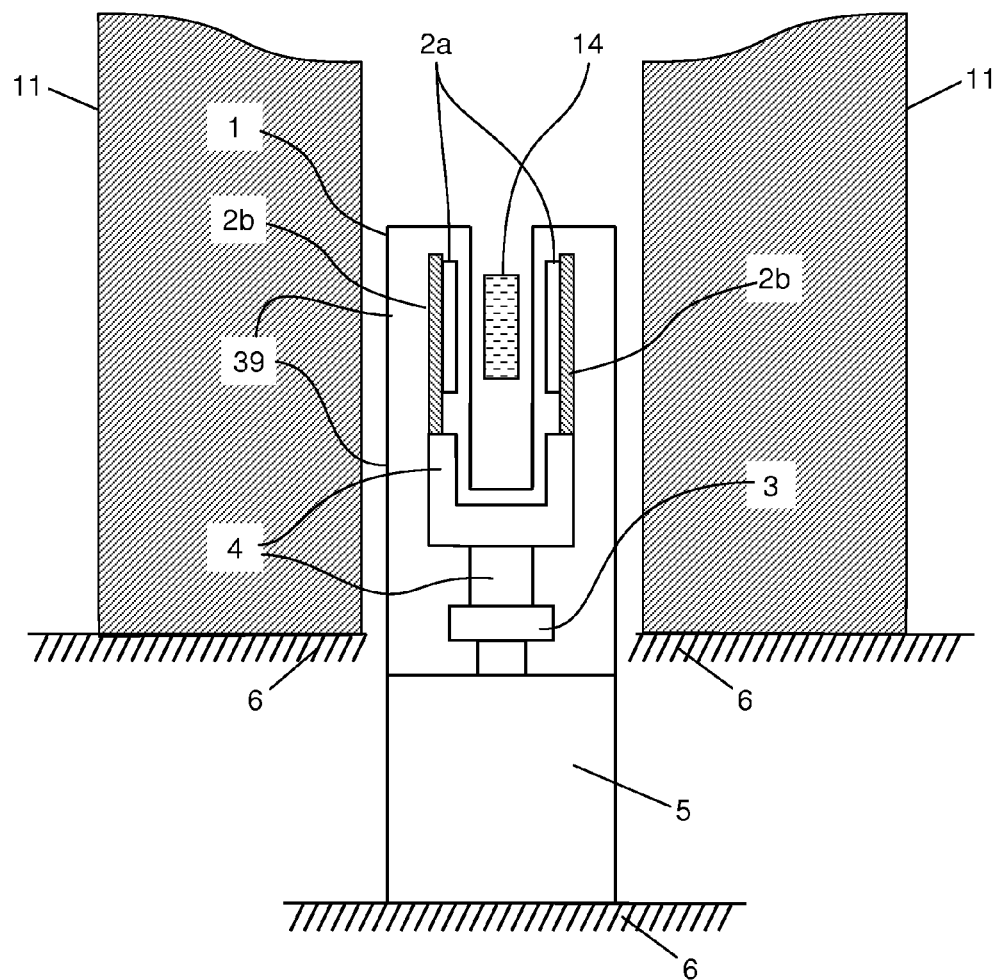
FIG. 2 shows the cooling device in accordance with prior art.

Many of the available cooling devices generate a broad complex vibration spectrum that is difficult to suppress with simple means. On the other hand, they are advantageous in that they provide high cooling powers.

Cooling devices of this type must not be directly connected to the NMR probehead 1 in high-resolution NMR applications, since they would cause large interferences in the NMR spectrum. For this reason, they need a separate cooling circuit (e.g. with liquid helium or nitrogen), which extends from the separately positioned cooling device to the NMR probehead and back. Transmission of vibrations from the cooling device to the NMR probehead is thereby largely prevented.

There are also other cooling devices 5a, b having a simple vibration spectrum which substantially only consists of one discrete fundamental frequency and its harmonics, wherein the latter are disadvantageous in that they provide only little cooling powers. This includes e.g. the "Free-piston Stirling cooler" (FPSC) with a noise spectrum that is predominantly only composed of the frequency of the reciprocating piston arrangement and its harmonics. Such FPSCs are simple, inexpensive and require little maintenance. The object of the inventive device is to directly connect the FPSC to the NMR probehead and suppress the vibration spectrum by means of sophisticated damping measures to such a degree that high-resolution NMR spectra can be satisfactorily measured.

For damping the vibrations of the cooling device 5a, b, a passive vibration absorber 9a, b [1] [5] is directly mechanically connected to the cooling device in order to effectively damp the vibrations of the cooling device already at the location where they are generated. The vibration absorber contains a damped, mechanical mass/spring oscillating circuit that is matched to the fundamental frequency of the reciprocating piston of the cooling device, thereby considerably damping the fundamental frequency of the vibrations of the cooling device. The vibration absorber may additionally contain further mass/spring oscillating circuits which also damp the harmonics of the vibrations.

The vacuum housing of the NMR probehead 1 consists of a lower part A and an upper part B. Part A is connected to the vacuum housing of the cooling device 5a in a vacuum-tight fashion. Part B is rigidly connected to part A via damping elements 30a, b, c, d. In order to guarantee vacuum tightness, the two parts A and B must additionally be connected to each other in a vacuum-tight fashion via a corrugated bellows 8a.

The damping elements 30a, b, c, d are each composed of upper 31a, b, c, d and lower 32a, b, c, d mounting elements, which are connected to each other through damping material 33a, b, c, d. These damping elements have the object of transmitting minimum mechanical vibrations from part A to part B of the NMR probehead 1.

In order to improve mechanical fixing of the NMR probehead 1, part B of the vacuum container 39 is mechanically connected to the carrier element of the shim system 38 via the contact surface 12.

The NMR probehead 1 contains the test sample 14 and the NMR resonator 2a, is located in an NMR magnet 11 during operation, and is moreover positioned in such a fashion that the NMR resonator is in the area of the magnetic center. The NMR resonator advantageously consists entirely or partially of HTS superconductor material.

Since the cooling power of the FPSC is smaller than that of many other cooling devices, it is important to design the heat transfer from the NMR resonator 2a to the cooling head 3a of the cooling device 5a in such a fashion that loss is minimized. At first, the cooling head of the cooling device must be connected in a thermally well conducting fashion to the heat conducting connecting element 4, which consists e.g. of copper, at the same time preventing the mechanical vibrations of the cooling head from being transmitted to the connecting element. This problem is solved by a thermally well conducting wire connector 7a which flexibly connects the cooling head to the heat conducting connecting element such that only very small mechanical forces, and therefore also only minimum vibrations, are transmitted.

The connection between the heat conducting connecting element 4 and the NMR resonator 2a is realized via a heat conducting carrier element 2b, which is used to mount the NMR resonator and is advantageously produced from copper or sapphire.

Although the heat conducting connecting element 4 is provided for cooling the NMR resonator 1, it can also be used to cool the preamplifier.

Connection of an active electromechanical vibration absorber 25 to the FPSC yields better results [4]. The vibration absorber consists of a linear motor 26, the stator of which is mounted directly to the FPSC and the movable part of which is connected to a mass element 27. When the linear motor then exerts a force onto the mass element and moves it, a counterforce is generated that acts on the stator of the linear motor and therefore also on the FPSC. The linear motor is driven by means of the digital control unit 21 in such a fashion that the mass element oscillates against the vibration of the FPSC and the oscillating amplitude of the mass element has exactly that value that is required for compensating the vibration of the FPSC.

Towards this end, two sensors, namely the acceleration sensor 15 and the inductive sensor 16 are mounted to the upper part of the FPSC. The acceleration sensor absorbs the mechanical vibrations that prevail at that location and converts them into a corresponding electrical error signal 17. The inductive sensor 16 detects the field changes derived from the drive motor of the FPSC and present at that location, and passes them on in the form of an electrical reference signal 18. The best results are obtained when both sensors are mounted as closely together as possible.

The amplitude of the signal from the inductive sensor 16 remains constant, is much stronger than that from the acceleration sensor 15, and has therefore a higher signal-to-noise ratio. For this reason, the inductive signal is excellently suited as reference signal for the control system.

The error signal 17 and the reference signal 18 are digitized in the two ADCs 19 and 20, respectively, and are supplied to the digital controller 21, where the amplitude and the phase of the error signal are determined by means of the reference signal and a control signal is derived therefrom. The latter is supplied to the adaptive filter 22 and is guided via an DAC 23 and via an amplifier unit 24 to the stator of the linear motor 26. The latter then oscillates the mass element 27 in such a fashion that vibrations of the FPSC are maximally compensated for. More details can be extracted from [4]. The vibrations that remain after compensation are largely suppressed by the wire connector 7a and the damping elements 30a, b, c, d.

In one further embodiment of the cooling system, several cooling devices are used for simultaneously cooling different objects. The coldheads of these cooling devices may but must not necessarily be at the same temperature level.

Figure 3:
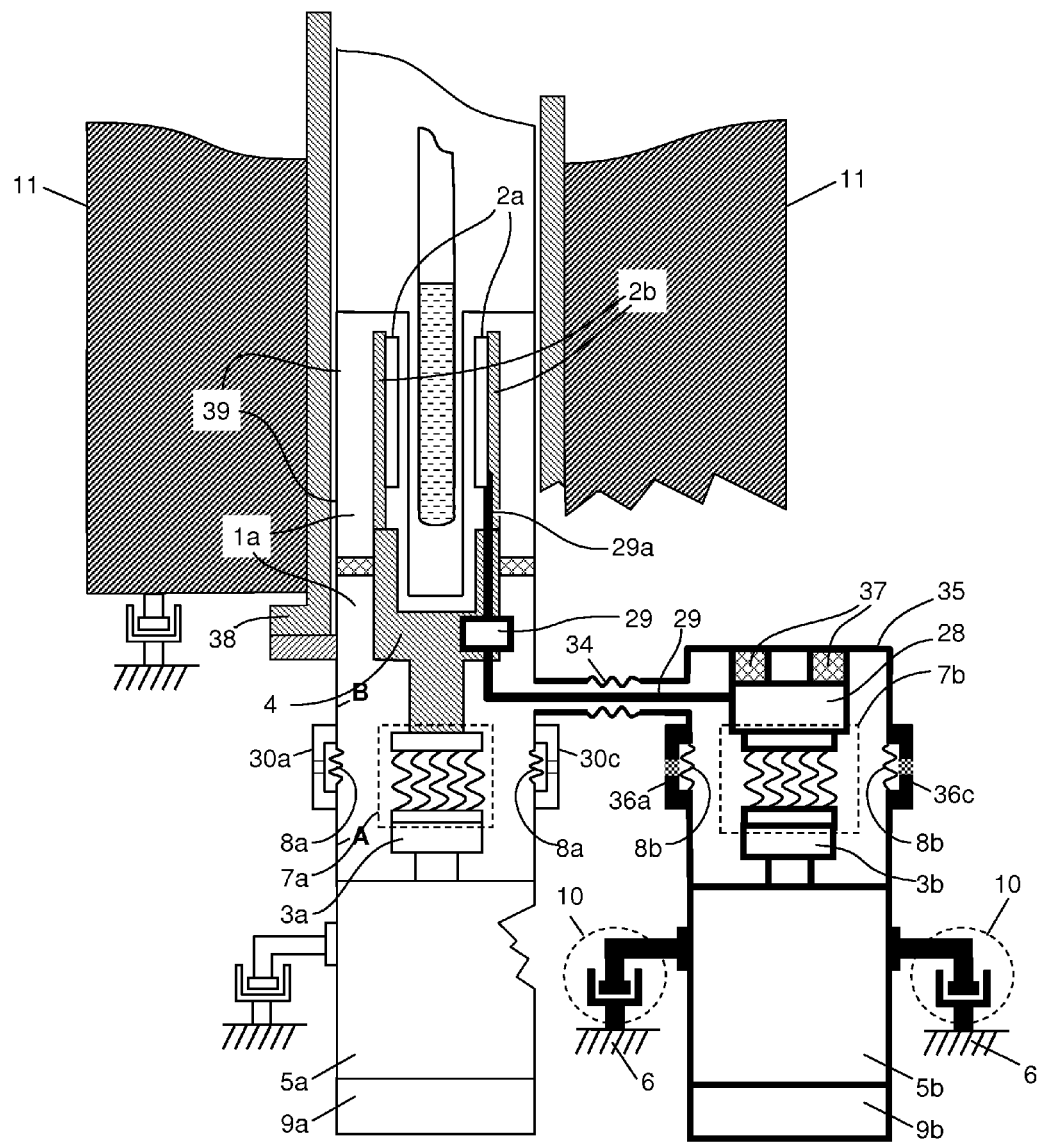
FIG. 3 shows the inventive NMR measuring system with cooling of the NMR preamplifiers 28 with a second cooling device 5b, wherein the vacuum housing 35 of the NMR preamplifiers is connected to the vacuum housing 1a of the probehead via a corrugated bellows 34, and the RF connection between the NMR preamplifiers and the NMR resonator 2a is realized through the inside of the corrugated bellows.
Figure 4:
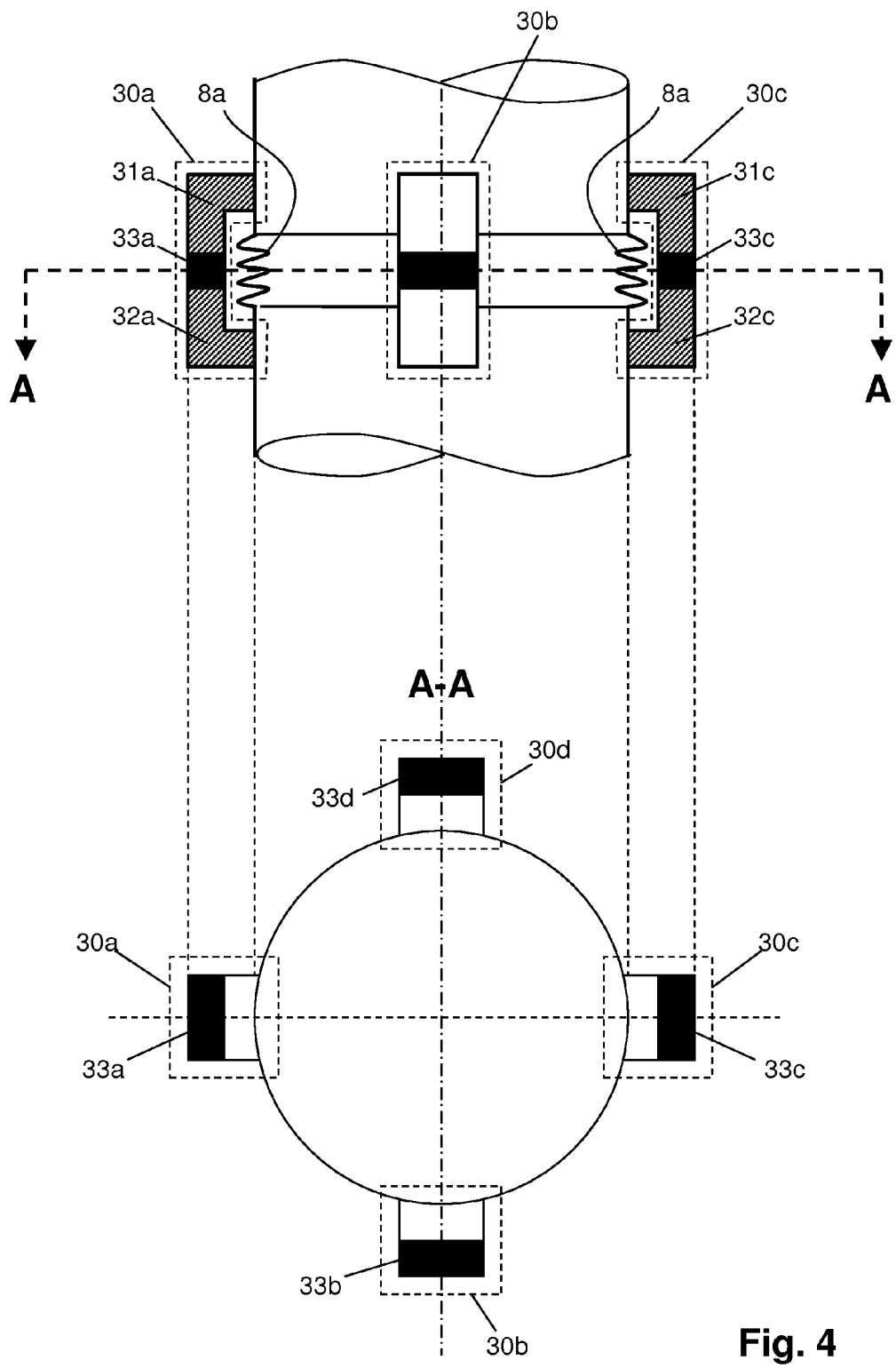
FIG. 4 shows damping elements 30a, b, c, d between part A and part B of the vacuum housing 39 of the NMR probehead 1, and a corrugated bellows 8a that connects part A to part B in a vacuum-tight fashion.
Figure 5:
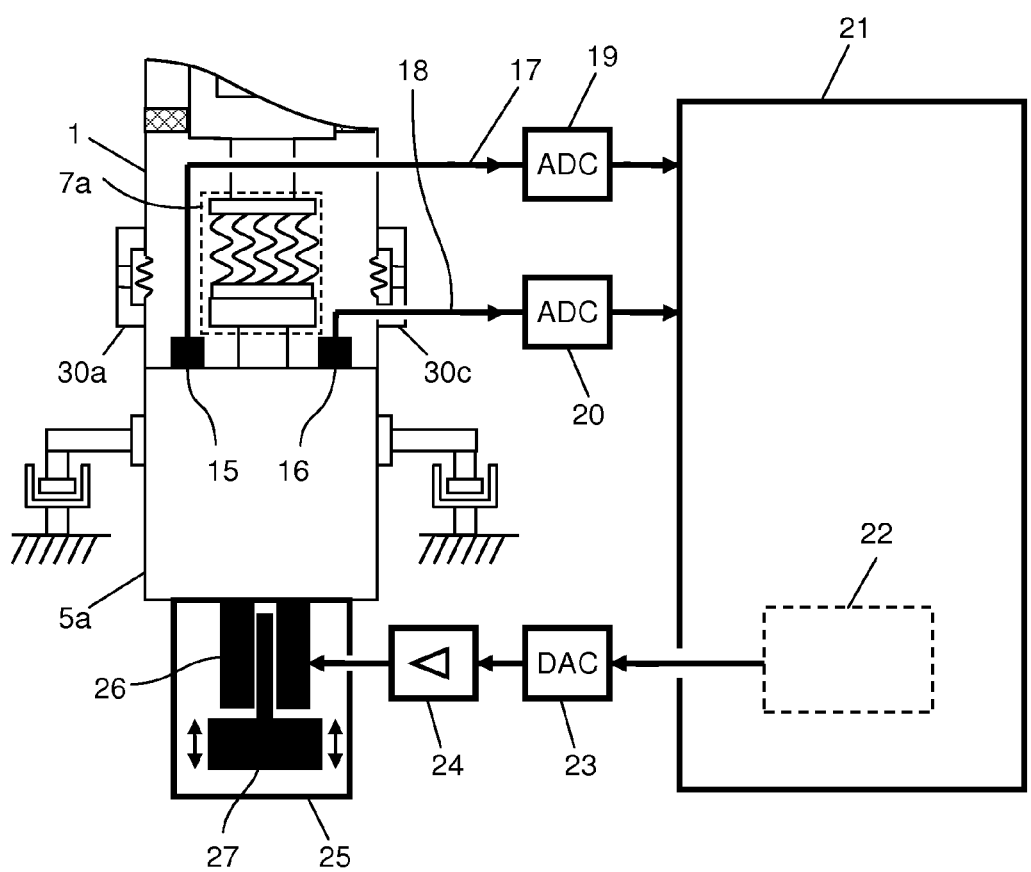
FIG. 5 shows the inventive device according to FIG. 1, wherein, however, the passive vibration absorber 9a has been replaced by an active vibration absorber 25 including associated digital control unit 21.

FIG. 3 shows a cooling system of this type, comprising two cooling devices 5a, 5b, wherein the first cooling device 5a is used to cool the NMR resonator 2a. The second cooling device 5b is used to cool at least one preamplifier 28 and advantageously has the same design as the first 5a, however, with the difference that the heat conducting connecting element 4 of the NMR probehead 1 has been replaced by the preamplifiers 28. The preamplifiers 28 are firmly connected via heat insulating mounting elements 37 to the low-vibration upper part of the vacuum housing 35.

A corrugated bellows 34 connects the vacuum housing 35 of the preamplifiers to that of the NMR probehead 1. The corrugated bellows may be regarded as a spring with a small spring constant and for this reason, it cannot transfer large forces and therefore large vibrations from one vacuum housing to another.

The NMR resonator 2a has an RF connection 29a to the RF network 29, which is used for matching the resonance and impedance of the NMR resonator. At least one RF cable 29b connects the RF network to at least one preamplifier 28, thereby utilizing the path through the corrugated bellows 34.

LIST OF REFERENCES

[1] U.S. Pat. No. 5,889,456
[2] U.S. Pat. No. 7,003,963
[3] U.S. Pat. No. 5,895,033 A
[4] U.S. Pat. No. 6,809,486 B2
"Dynamic counterbalancing the single-piston linear compressor of a Stirling cryogenic cooler" A. Veprik, I. Nachman, N. Pundak, Cryogenics, 49 (2009) 165-170

LIST OF REFERENCE NUMERALS

NMR: "Nuclear Magnetic Resonance"
FPSC: "Free-Piston Stirling Cooler"
1 NMR probehead
2a NMR resonator (transmitting/receiving resonators)
2b heat conducting carrier element that is used to mount the NMR resonator 2a
3a cooling head of the cooling device 5a for cooling the NMR probehead
3b cooling head of the cooling device 5b which is used to cool the preamplifiers
4 heat conducting connecting element
5a cooling device (e.g. Stirling Cooler) for cooling the NMR resonator 2a
5b cooling device (e.g. Stirling Cooler) for cooling the preamplifiers 28
6 laboratory floor
7a wire connector that transfers the heat from the heat conducting connecting element 4 to the cooling head 3a
7b wire connector that transfers the heat from the preamplifiers 28 to the cooling head 3b
8a corrugated bellows that ensures vacuum tightness of the vacuum housing at the location of the damping elements 30a, b, c, d and at the same time does not impair the functionality of these damping elements
8b corrugated bellows that ensures vacuum tightness of the vacuum housing 35 at the location of the damping elements 36a, b, c, d and at the same time does not impair the functionality of these damping elements
9a passive vibration absorber on the cooling device 5a
9b passive vibration absorber on the cooling device 5b
10 damping elements that connect the cooling device 5 to the laboratory floor 6 and suppress mechanical vibration transmission between these two objects
11 NMR magnet system
12 contact surface via which the NMR probehead 1 is connected to the carrier element of the shim system 38 in order to improve the mechanical stability of the NMR probehead
13 heat insulating mountings
14 NMR test sample
15 acceleration sensor for measuring the remaining vibrations error signal from the cooling device 5
16 inductive sensor for detecting the magnetic field derived from the drive motor of the cooling device 5, which is directly correlated to the mechanical vibrations of the cooling device
17 error signal from the acceleration sensor 15

18 reference signal from the inductive sensor 16
19 analog-digital converter (ADC) for the error signal 17
20 analog-digital converter (ADC) for the reference signal 18
21 digital control unit containing an adaptive filter 22
22 adaptive filter
23 digital-analog converter (DAC)
24 amplifier unit consisting of preamplifier and power amplifier
25 active vibration absorber including control loop
26 linear motor
27 mass element
28 one or more cooled preamplifier(s)
29 RF network for matching the resonance and impedance of the NMR resonator 2a
29a RF connection that connects the NMR resonator 2a to the RF network 29
29b one or more RF lines that connect(s) the RF network 29 to one or more preamplifier(s) 28
30a, b, c, d damping elements that are mounted to the lower and upper part of the vacuum housing of the NMR probehead 1 and are designed to suppress vibrations from the lower to the upper part of the vacuum housing of the NMR probehead
31a, b, c, d upper mounting elements of the damping elements 30a, b, c, d
32a, b, c, d lower mounting elements of the damping elements 30a, b, c, d
33a, b, c, d damping material in the damping elements 30a, b, c, d
34 corrugated bellows that connects the upper part of the vacuum housing 35 to the upper part of the vacuum housing of the NMR probehead 1 and suppresses vibrations from the vacuum housing to the NMR probehead and vice versa
35 vacuum housing of the preamplifiers 28
36a, b, c, d damping elements that are mounted to the lower and upper parts of the vacuum housing 35 and are designed to suppress vibrations from the lower to the upper part of the vacuum housing
37 heat insulating mounting elements of the preamplifiers 28
38 NMR shim system
39 vacuum housing of the probehead 1
40 damping elements that connect the magnet system 11 to the laboratory floor 6 and partially suppress transmission of mechanical vibrations between these two objects

We claim:

1. An NMR (nuclear magnetic resonance) measuring system, for measuring a test sample, the measuring system comprising:
an NMR magnet system;
a vacuum housing disposed within said NMR magnet system, said vacuum housing having a lower part and an upper part;
an NMR probehead disposed within said vacuum housing;
an NMR resonator disposed within said NMR probehead to surround the test sample;
a cooling device having a cooling head, said cooling device generating a vibration spectrum that only consists of individual selective frequencies;
a heat conducting carrier element in thermal connection with said NMR resonator;
a heat conducting connecting element, disposed between and in thermal connection with said heat conducting carrier element and said cooling head, wherein said cooling device, said heat conducting carrier element and said heat conducting connecting element are disposed, structured and dimensioned to cool said NMR resonator to cryogenic temperatures;
a vibration absorber mechanically connected to said cooling device, said vibration absorber having at least one oscillating mass element, wherein said at least one oscillating mass element has a resonance frequency which is adjusted to a vibration frequency of said cooling device or to a harmonic thereof;
a mechanically flexible connecting element having good thermal conducting properties, said mechanically flexible connecting element disposed between and connecting said cooling head to said heat conducting connecting element;
at least one damping element disposed between and connecting said upper and said lower parts of said housing;
a diaphragm or corrugated bellows disposed between and connecting said lower and said upper parts of said housing in a vacuum-tight and mechanically flexible manner;
heat insulating mountings disposed between and fixing said connecting element to said housing; and
a shim system to which said probehead is mechanically fixed.

2. The NMR measuring system of claim 1, further comprising a further vacuum housing having a lower part and an upper part, a preamplifier disposed within said further vacuum housing, a further cooling device having a cooling head, said further cooling device generating a vibration spectrum that only consists of individual selective frequencies, a further vibration absorber, mechanically connected to said further cooling device, said further vibration absorber having at least one further oscillating mass element, said at least one further oscillating mass element having a resonance frequency which is adjusted to a vibration frequency of said further cooling device or to a harmonic thereof, a further mechanically flexible connecting element having good thermal conducting properties, said further mechanically flexible connecting element disposed between and connecting said cooling head of said further cooling device to said preamplifier, at least one further damping element disposed between and connecting said upper and said lower parts of said further vacuum housing, a further diaphragm or corrugated bellows disposed between and connecting said lower and said upper parts of said further housing in a vacuum-tight and mechanically flexible manner and further heat insulating mountings disposed between and fixing said preamplifier to said further housing.

3. The NMR measuring system of claim 2, wherein said further cooling device is a FPSC (Free-Piston Stirling Cooler).

4. The NMR measuring system of claim 2, wherein at least three damping elements are arranged between said lower part and said upper part of said further vacuum housing of said preamplifier.

5. The NMR measuring system of claim 1, wherein said cooling device is a FPSC (Free-Piston Stirling Cooler).

6. The NMR measuring system of claim 1, wherein said mechanically flexible connecting element comprises a wire connector.

7. The NMR measuring system of claim 1, wherein at least three damping elements are arranged between said lower part and said upper part of said vacuum housing of said probehead.

8. The NMR measuring system of claim 7, wherein said damping elements are symmetrically arranged around a longitudinal axis of said probehead in a plane perpendicular to said longitudinal axis.

9. The NMR measuring system of claim 1, wherein said cooling device is mechanically connected to a laboratory floor via at least three further damping elements.

10. The NMR measuring system of claim 1, wherein said connecting element comprises copper.

11. The NMR measuring system of claim 1, wherein said carrier element comprises copper or sapphire.

12. The NMR measuring system of claim 1, wherein said NMR resonator comprises a high-temperature superconductor (HTS) material.

13. The NMR measuring system of claim 1, wherein said vibration absorber is an active vibration absorber which contains a linear motor interacting for movement of said mass element and being part of a closed control loop, said linear motor being controlled by a digital control unit that is also arranged in said control loop, wherein mechanical vibrations of said cooling device and of said active vibration absorber at least largely mutually compensate each other.

14. The NMR measuring system of claim 13, wherein said control unit receives an error signal from an acceleration sensor via an analog-digital converter (ADC) and also receives a reference signal from an inductive sensor via an ADC, wherein an output of said control unit is connected to said linear motor via a digital-analog converter (DAC) and an amplifier unit.

15. The NMR measuring system of claim 13, wherein said control unit contains an adaptive filter, an output signal of which is also an output signal of said control unit.

* * * * *